United States Patent [19]

Winstel et al.

[11] Patent Number: 4,744,835
[45] Date of Patent: May 17, 1988

[54] ARRANGEMENT FOR AVOIDING UNWANTED DEGRADATION IN NO-LOAD OPERATION OF SOLAR CELL MODULES COMPOSED OF AMORPHOUS SILICON

[75] Inventors: Guenter Winstel; Rolf Plaettner, both of Ottobrunn, Fed. Rep. of Germany

[73] Assignee: Siemens Aktiengesellschaft, Berlin and Munich, Fed. Rep. of Germany

[21] Appl. No.: 160

[22] Filed: Jan. 2, 1987

[30] Foreign Application Priority Data

Mar. 25, 1986 [DE] Fed. Rep. of Germany ....... 3610083

[51] Int. Cl.⁴ .................. H02N 6/00; H01L 25/04
[52] U.S. Cl. .................. 136/244; 136/258; 136/293
[58] Field of Search ............. 136/244, 293, 258 AM

[56] References Cited

U.S. PATENT DOCUMENTS 4,595,789 6/1986 Nagase et al. ............ 136/244

FOREIGN PATENT DOCUMENTS 61-141184 6/1986 Japan ................. 136/293

OTHER PUBLICATIONS

M. Moeller, et al., "Enhanced Stability of Amorphous Silicon pin Solar Cells by Doping Profiles", Mat. Res. Soc. Symp. Procedure, vol. 49, 1985, Materials Research Society, pp. 325-330.

Primary Examiner—Aaron Weisstuch
Attorney, Agent, or Firm—Hill, Van Santen, Steadman & Simpson

[57] ABSTRACT

In order to avoid unwanted degradation in no-load operation of solar cell modules composed, in particular, of amorphous silicon, an internal load resistor is integrated in the module and is connected across the output terminals during no-load operation of the module. Disconnection of the resistor during load operation occurs either in a mechanical manner by way of a mechanical switch integrated in a plug extending to the load or occurs automatically by way of an electronic switch. The arrangement is employed in operation of solar cell modules for systems having a non-continuous power consumption such as, for example, appliances in mobile homes, mountain chalets and the like.

5 Claims, 1 Drawing Sheet

ARRANGEMENT FOR AVOIDING UNWANTED DEGRADATION IN NO-LOAD OPERATION OF SOLAR CELL MODULES COMPOSED OF AMORPHOUS SILICON

BACKGROUND OF THE INVENTION

1. Field of the Invention

The present invention is directed to an arrangement for avoiding unwanted degradation in no-load operation of, in particular, solar cells composed of amorphous silicon, the solar cells being interconnected in modules.

2. Description of the Prior Art

Solar cells can be particularly advantageously employed where little maintenance for systems or devices is possible or other electrical energy sources are not available. The latter is particularly true for the use of small appliances for mobile homes, sail boats, mountain chalets and the like.

Recently, amorphous silicon solar cells have gained increasing significance. In comparison to crystalline silicon solar cells, amorphous silicon solar cells have the advantage of less expensive manufacture as a result of their thin-film structure. The stability of solar cells of amorphous silicon, however, causes problems whose elimination has become the subject matter of many investigations. Therefore, for example, a report of M. Moeller et al in the conference of the Materials Research Society Symposiums, Vol. 49, 1985, pp. 325–330 discloses that the stability behavior of amorphous silicon solar cells can be improved in that, given p-i-n solar cells having a transparent base electrode composed of doped tin oxide, a boron doping profile decreasing in the direction of the i-n junction, be incorporated into the i layer when the light incidence occurs from the n side or that, given irradiation from the p side, the i layer contains a phosphorous doping profile which increases in the direction of the i-n junction.

The measures discussed above also lead to solar cells or, respectively, solar cell modules in which a considerable aging occurs under load, i.e. given a connected load, than in no-load operation of the module. This is particularly the case with modules having efficiencies above 5% that are manufactured with the cell type glass substrate/tin oxide as a base electrode/p-SiC-i-n as a thin film/metal as a rear electrode.

Given suitable manufacture, the degradation of these modules after an initial aging of a few percent can be extremely low, for example, less than 10% after ten years operation in sunlight when they are continuously operated under load. Operation under no-load conditions, by contrast, can lead to the doubling of the degradation. The no-load conditions occur when the module is mistakenly not connected to the load or when the load, despite a cable connection, is separated from the module either intentionally or unintentionally, for example given a cable malfunction. The end effect in any case, however, is a premature, unnoticed decrease of the module power caused by the degradation.

SUMMARY OF THE INVENTION

The object of the present invention, therefore, is to prevent the above effect of degradation without greater expense.

In an arrangement of the type generally set forth above, the above object is achieved, according to the present invention, in that an internal load resistor $R_L$ is integrated in the module and is disconnected during operation of the module. It is thereby within the scope of the invention that either a switch integrated in the plug to the load is provided, the switch being switched on in a mechanical manner when the module is separated from the load or that an electronic switch is provided in the module, the electronic switch automatically reacting to the operating condition "no-load" or "load".

BRIEF DESCRIPTION OF THE DRAWINGS

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
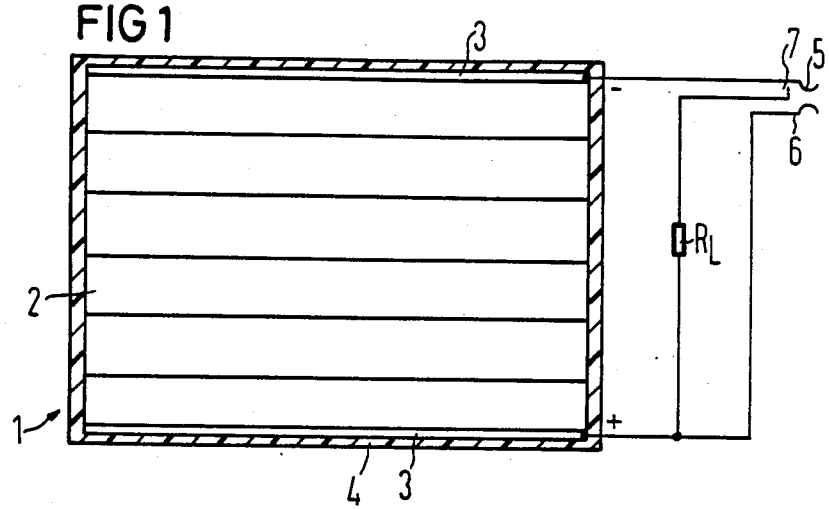
FIG. 1 is a schematic representation of a mechanical switching apparatus and technique.

Referring to FIG. 1, a module 1 comprises a plurality of solar cells 2 which are connected to one another in an electrically conductive manner and which are provided with two contact strips 3. A pair of contacts 5 and 6 are connected to a housing 4 of the module and to the contact strips 3, the solar cells 2 generating electrical current for connection to a load by way of the contacts 5 and 6. A switch circuit 7 comprising a load resistor $R_L$ is integrated in parallel with the contacts 5,6 which are constructed as a plug. Switch 7 is closed to place load resistor $R_L$ across the output terminals when the module is separated from the load, i.e. when it is operated in a no-load condition. Switch 7 is opened when the load is connected, i.e. when the module is in operation.

Figure 2:
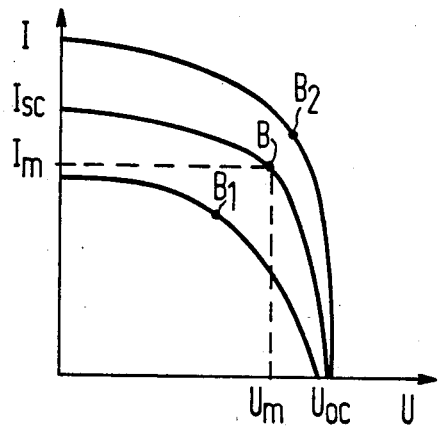
FIG. 2 is a graphic illustration of the field characteristics of an amorphous silicon solar cell.
Figure 3:
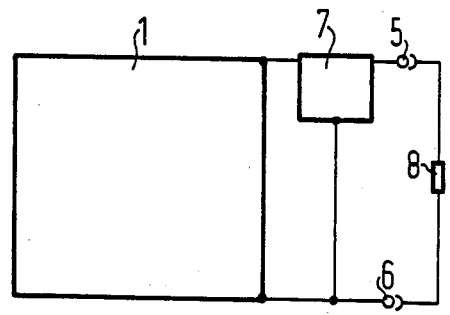
FIG. 3 is a schematic representation similar to that of FIG. 1 using an electronic switch.

It can be seen from the field characteristics illustrated in FIG. 2 that a relatively steep dependency of the current I on the voltage U or, respectively, on the load (the load 8 in FIG. 3) is characteristic of the "no-load" operating condition $U_{oc}$ given illumination ($B_1$, B, $B_2$). This steep dependency can be used for switching the internal load resistor $R_L$ into the circuit (within the electronic load switch 7 in FIG. 3) since it differs from the behavior of the operating point B of the characteristic. The curves $B_1$, B, $B_2$ apply to different intensities of the illumination. The short-circuit current is referenced $I_{sc}$.

A further possibility is available in that the current flow across the load itself is utilized as a switching signal.

In another circuit construction, voltage and current tapped in a suitable manner can be utilized such that the internal load resistor $R_L$ is disconnected only when the signal $I_m/U_m$ (see FIG. 2) exceeds a defined value. In all cases, a simple-cost-effective circuit can be employed which does not have a significant influence on the cost of the module and which has only a low power consumption.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for avoiding unwanted degradation in no-load operation of amorphous silicon solar cells which are interconnected to form a module which has a pair of output contacts which extend to load terminals, comprising:
   an internal load resistor integrated within the module; and
   switching means operable upon disconnection of the load terminals from a load to connect said internal load resistor across said output contacts.

2. The arrangement of claim 1, wherein:
   said switching means comprises a mechanical switch.

3. The arrangement of claim 1, wherein:
   said switching means comprises an electronic switch connected to said contacts.

4. The arrangement of claim 3, wherein:
   said switching means comprises means for sensing the load current as a signal for causing switching of said internal load resistor.

5. The arrangement of claim 3, wherein:
   said switching means comprises means for sensing a predetermined value of current-voltage ratio as a signal for causing operation of said switching means.

* * * * *